(12) United States Patent
Choi (10) Patent No.: US 7,824,829 B2
(45) Date of Patent: Nov. 2, 2010

(54) METHOD OF MONITORING FOCUS IN LITHOGRAPHIC PROCESSES

(75) Inventor: Yong Seok Choi, Mckinney, TX (US)

(73) Assignee: Texas Instruments Incorporated, Dallas, TX (US)

(*) Notice: Subject to any disclaimer, the term of this patent is extended or adjusted under 35 U.S.C. 154(b) by 663 days.

(21) Appl. No.: 11/769,436

(22) Filed: Jun. 27, 2007

(65) Prior Publication Data
US 2009/0004572 A1 Jan. 1, 2009

(51) Int. Cl.
  *G03F 9/00* (2006.01)
  *G03C 5/00* (2006.01)
(52) U.S. Cl. .................................. 430/30; 430/313
(58) Field of Classification Search .............. 430/5, 430/30, 313; 257/48
See application file for complete search history.

(56) References Cited

U.S. PATENT DOCUMENTS

| | | | |
|---|---|---|---|
| 5,300,786 A * | 4/1994 | Brunner et al. ............. | 250/548 |
| 6,063,531 A | 5/2000 | Singh et al. | |
| 6,376,139 B1 * | 4/2002 | Fujisawa et al. ............. | 430/30 |
| 6,909,930 B2 | 6/2005 | Shishido et al. | |
| 7,108,945 B2 * | 9/2006 | Sutani et al. .................. | 430/5 |
| 7,455,939 B2 * | 11/2008 | Brunner et al. ............... | 430/5 |

* cited by examiner

*Primary Examiner*—Christopher G Young
(74) *Attorney, Agent, or Firm*—Warren L. Franz; Wade J. Brady, III; Frederick J. Telecky, Jr.

(57) ABSTRACT

The present disclosure is directed to a method for monitoring focus of a photolithography system. The method comprises providing a substrate and depositing a photoresist layer on the substrate. At least one photomask is provided comprising one or more forbidden pitch photomask patterns formed thereon. The forbidden pitch patterns are imaged in the photoresist layer by exposing the photoresist layer to radiation through the at least one photomask. The imaged forbidden pitch patterns are developed in the photoresist. Focus error information regarding the imaging process can be determined using the developed forbidden pitch patterns.

16 Claims, 5 Drawing Sheets

| | 1 | 2 | 3 | 4 | 5 | 6 | 7 | 8 | 9 | 10 | 11 |
|---|---|---|---|---|---|---|---|---|---|---|---|
| A | | | 45.2 | 49.7 | 52.8 | 55.5 | 59.1 | 61.6 | 63.9 | | |
| B | | 44.4 | 47.6 | 51.6 | 53.9 | 56.3 | 59.9 | 62.3 | 66.3 | 67.1 | |
| C | | 46.9 | 48.6 | 52.1 | 54.7 | 57.9 | 59.2 | 62.3 | 64.9 | 66.6 | |
| D | 41.6 | 44.5 | 48.8 | 52.8 | 55.6 | 58.0 | 59.5 | 61.5 | 64.4 | 66.5 | 68.6 |
| E | | 45.4 | 49.3 | 52.4 | 53.8 | 58.0 | 59.5 | 62.1 | 65.3 | 66.1 | |
| F | | 42.7 | 46.8 | 49.2 | 53.1 | 57.0 | 59.5 | 62.6 | 64.6 | 66.7 | |
| G | | | 44.9 | 48.2 | 52.2 | 55.3 | 58.5 | 60.7 | 64.8 | | |

FIG. 6A

|   | 1 | 2 | 3 | 4 | 5 | 6 | 7 | 8 | 9 | 10 | 11 |
|---|---|---|---|---|---|---|---|---|---|----|----|
| A |   |   | 32.9 | 34.9 | 33.2 | 44.3 | 44.3 | 58.6 | 48.2 |   |   |
| B |   | 45.0 | 48.0 | 58.4 | 64.0 | 66.4 | 40.1 | 45.7 | 48.8 | 38.2 |   |
| C |   | 44.4 | 51.7 | 58.1 | 61.6 | 65.7 | 66.4 | 76.2 | 77.4 | 72.6 |   |
| D | 56.1 | 58.2 | 65.9 | 68.5 | 70.9 | 72.8 | 78.5 | 78.8 | 79.8 | 85.7 | 87.2 |
| E |   | 54.8 | 52.8 | 63.1 | 59.4 | 67.5 | 71.5 | 72.6 | 75.7 | 80.3 |   |
| F |   | 24.1 | 63.6 | 67.7 | 70.2 | 36.6 | 47.4 | 52.7 | 50.5 | 60.0 |   |
| G |   |   |   | 62.7 | 44.3 | 58.4 | 101.8 | 61.4 | 48.1 |   |   |

*FIG. 6B*

|   | 1 | 2 | 3 | 4 | 5 | 6 | 7 | 8 | 9 | 10 | 11 |
|---|---|---|---|---|---|---|---|---|---|----|----|
| A |   |   | 42.5 | 41.8 | 39.9 | 47.8 | 46.9 | 53.6 | 49.7 |   |   |
| B |   | 47.7 | 46.6 | 58.4 | 57.8 | 70.6 | 46.7 | 61.2 | 48.0 | 56.2 |   |
| C |   | 58.6 | 52.8 | 54.2 | 64.3 | 71.1 | 61.4 | 73.6 | 76.4 | 71.9 |   |
| D | 53.0 | 57.4 | 63.6 | 67.3 | 71.1 | 71.7 | 77.3 | 78.0 | 82.0 | 83.5 | 85.2 |
| E |   | 51.9 | 52.9 | 57.1 | 56.6 | 62.6 | 70.3 | 72.9 | 74.2 | 79.3 |   |
| F |   | 49.3 | 27.1 | 31.5 | 29.4 | 67.6 | 43.1 | 55.7 | 45.7 | 55.4 |   |
| G |   |   |   | 51.9 | 37.8 | 48.0 | 48.6 | 68.5 | 53.8 |   |   |

|   | 1 | 2 | 3 | 4 | 5 | 6 | 7 | 8 | 9 | 10 | 11 |
|---|---|---|---|---|---|---|---|---|---|----|----|
| A | 0 | 0 | -15.1 | -22.8 | -32.4 | -19 | -27 | -11 | -30 | 0 | 0 |
| B | 0 | 3.91 | -0.67 | 13.68 | 14.1 | 24.45 | -33 | -17.7 | -35.9 | -39.8 | 0 |
| C | 0 | 9.25 | 7.24 | 7.95 | 16.46 | 20.99 | 9.33 | 25.05 | 24.03 | 11.24 | 0 |
| D | 25.81 | 26.49 | 31.76 | 30.26 | 30.91 | 28.55 | 36.65 | 33.78 | 33.03 | 36.11 | 35.22 |
| E | 0 | 15.96 | 7.02 | 15.32 | 8.46 | 14.14 | 22.87 | 21.27 | 19.27 | 27.32 | 0 |
| F | 0 | -11.8 | -2.86 | 0.81 | -6.51 | -9.78 | -28.5 | -16.8 | -32.9 | -18 | 0 |
| G | 0 | 0 | -89.7 | 18.29 | -22.3 | -4.24 | 33.35 | 8.61 | -27.7 | 0 | 0 |

*FIG. 6D*

|   | 1 | 2 | 3 | 4 | 5 | 6 | 7 | 8 | 9 | 10 | 11 |
|---|---|---|---|---|---|---|---|---|---|---|---|
| A |   |   | 73.5 | 27.4 | 26.3 | 32.5 | 26.5 | 28.9 | 36.8 |   |   |
| B |   | 35.3 | 30.0 | 28.2 | 31.1 | 28.3 | 31.8 | 32.7 | 42.5 | 31.1 |   |
| C |   | 29.9 | 27.3 | 23.2 | 27.1 | 24.8 | 29.5 | 23.7 | 24.0 | 27.2 |   |
| D | 22.5 | 22.9 | 20.0 | 19.5 | 22.3 | 19.3 | 19.8 | 21.8 | 19.9 | 18.8 | 19.0 |
| E |   | 21.0 | 21.4 | 24.0 | 20.1 | 19.4 | 19.5 | 18.6 | 19.3 | 17.8 |   |
| F |   | 96.2 | 76.5 | 61.3 | 52.4 | 29.8 | 23.3 | 21.5 | 17.4 | 19.5 |   |
| G |   |   | 77.31 | 76.6 | 67.7 | 44.6 | 88.3 | 47.7 | 41.9 |   |   |

*FIG. 7A*

|   | 1 | 2 | 3 | 4 | 5 | 6 | 7 | 8 | 9 | 10 | 11 |
|---|---|---|---|---|---|---|---|---|---|---|---|
| A |   |   | -16.2 | 24.7 | 20.9 | 19.8 | 21.3 | 23.2 | 9.0 |   |   |
| B |   | 28.0 | 29.0 | 38.6 | 32.8 | 46.0 | 15.0 | 26.2 | -0.9 | 18.0 |   |
| C |   | 41.9 | 36.9 | 38.9 | 42.5 | 48.4 | 32.8 | 47.6 | 47.5 | 38.0 |   |
| D | 48.8 | 50.0 | 54.7 | 55.0 | 53.2 | 54.4 | 57.9 | 54.8 | 57.8 | 58.2 | 57.6 |
| E |   | 45.6 | 42.1 | 40.6 | 42.7 | 45.2 | 51.3 | 52.2 | 49.6 | 55.4 |   |
| F |   | -29.5 | -36.2 | -19.0 | -16.0 | 40.8 | 20.3 | 31.6 | 23.7 | 29.2 |   |
| G |   |   | -62.2 | -12.9 | -22.1 | 8.1 | -38.3 | 20.2 | 7.1 |   |   |

|   | 1 | 2 | 3 | 4 | 5 | 6 | 7 | 8 | 9 | 10 | 11 |
|---|---|---|---|---|---|---|---|---|---|---|---|
| A |   |   | -88.6 | -50.2 | -58.6 | -51.5 | -53.5 | -39.9 | -66.7 |   |   |
| B |   | -31.4 | -30.7 | -14.5 | -17.0 | -3.8 | -64.8 | -50.4 | -78.4 | -70.9 |   |
| C |   | -20.6 | -20.1 | -15.2 | -10.6 | -3.8 | -20.1 | 1.4 | 0.0 | -16.0 |   |
| D | 3.3 | 3.6 | 11.8 | 10.8 | 8.6 | 9.3 | 16.9 | 12.0 | 13.2 | 17.3 | 16.2 |
| E |   | -5.0 | -14.4 | -8.7 | -11.7 | -5.2 | 3.3 | 2.7 | 0.0 | 9.6 |   |
| F |   | -108.1 | -79.4 | -60.5 | -58.9 | -39.5 | -51.8 | -38.3 | -50.3 | -37.5 |   |
| G |   |   | -167.1 | -58.3 | -90.1 | -48.8 | -55.0 | -39.1 | -69.6 |   |   |

*FIG. 8*

METHOD OF MONITORING FOCUS IN LITHOGRAPHIC PROCESSES

DESCRIPTION OF THE DISCLOSURE

1. Field of the Disclosure

The present disclosure relates generally to the field of photolithography, and more specifically to a method for monitoring focus in photolithography processes.

2. Background of the Disclosure

Conventional optical projection lithography has been the standard silicon patterning technology for the past 20 years. It is an economical process due to its inherently high throughput thereby providing a desirable low cost per pad or die produced. A considerable infrastructure (including steppers, photomasks, resists, metrology, etc.) has been built rip around this technology.

In this process, a photomask, or "reticle", includes a device pattern formed of an opaque material, such as chrome, on a transparent or semitransparent substrate. The transmission of the opaque material may vary, such as in the case of an attenuating phase shift mask. The device pattern of the reticle can be transferred to a photoresist film using imaging techniques well known in the ad. For example, a stepper that includes a light source and optics that project light coming through the reticle can be used to image the device pattern, often with, for example, a 4× to 5× reduction factor, onto a photoresist film. The photoresist can then be developed and used as a mask pattern for processing the device, as is well known in the art.

In photolithography, failing to achieve acceptable focus of the pattern during the imaging process can result in pattern defects, which can translate into device defects and possibly device failure. Further, as the critical dimensions of integrated circuits continue to decrease, the parameters for achieving acceptable focus of the imaging pattern have become more stringent. For example, the Rayleigh depth of focus has continued to decrease while at the same time stepper lens fields of view have grown, compounding the problem of keeping all parts of the field in acceptable focus.

In order to improve focus control and reduce focus errors, methods for monitoring and controlling focus variations and/or focus errors within a process have been developed. For example, methods that include incorporating test patterns on the photomask are sometimes employed.

The test patterns generally include both dense monitoring features, which have a pitch representative of the dense features on the device being formed, and isolate monitoring features, which have a pitch that is much greater than the dense features in order to proximate isolated featured formed on the device. The test patterns can be transmitted onto the surface of the resist along with the image of the desired device, which may be, for example, an integrated circuit device. The test pattern can be monitored using techniques, such as critical dimension SEM ("CDSEM") or Scatterometry, to determine if the device pattern formed in the photoresist is within desired process specifications. When the CDSEM monitoring features get out of specification, the patterned wafers often need to be reworked, which can involve stripping the resist pattern and depositing and patterning another photoresist layer. Examples of well known focus monitoring methods are disclosed in U.S. Pat. No. 6,063,531, issued to Singh et al. on May 16, 2000; and U.S. Pat. No. 6,909,930, issued to Shishido et al. on Jun. 21, 2005.

In view of shrinking critical dimensions and the associated difficulties in achieving acceptable focus, further improvements in focus monitoring techniques are desired. For example, techniques for enhancing the sensitivity of focus monitoring to allow for earlier detection of defocus and adjustment of focus parameters would be welcome improvements in the lithography arts. Further, improvements which allow focus errors to be corrected before critical dimension device patterns are out of specification would also be considered a welcome improvement in the art.

SUMMARY OF THE DISCLOSURE

An embodiment of the present disclosure is directed to a method for monitoring focus of a photolithography system. The method comprises providing a substrate and depositing a photoresist layer on the substrate. At least one photomask is provided comprising one or mere forbidden pitch photomask patterns formed thereon. The forbidden pitch patterns are imaged in the photoresist layer by exposing the photoresist layer to radiation through the at least one photomask. The imaged forbidden pitch patterns are developed in the photoresist. Focus error information regarding the imaging process can be determined using the developed forbidden pitch patterns.

Another embodiment of the present disclosure is directed to a device manufacturing method. The method comprises providing a substrate and depositing a photoresist layer on the substrate. At least one photomask is provided comprising one or more forbidden pitch photomask patterns formed thereon. The forbidden pitch patterns are imaged in the photoresist by exposing the photoresist to radiation through the at least one photomask. The imaged forbidden pitch patterns are developed in the photoresist. Focus error information regarding the imaging process can be determined using the developed forbidden pitch patterns. The substrate is etched using the photoresist pattern as a mask and the photoresist pattern is removed.

Additional embodiments and advantages of the disclosure will be set forth in part in the description which follows, and can be learned by practice of the disclosure. It is to be understood that both the foregoing general description and the following detailed description are exemplary and explanatory only and are not restrictive of the disclosure, as claimed.

The accompanying drawings, which are incorporated in and constitute a part of this specification, illustrate several embodiments of the disclosure and, together with the description, serve to explain the principles of the disclosure.

DESCRIPTION OF THE EMBODIMENTS

Reference will now be made in detail to various exemplary embodiments of the present disclosure, examples of which are illustrated in the accompanying drawings. Wherever possible, the same or similar reference numbers will be used throughout the drawings to refer to the same or like parts.

Figure 1:
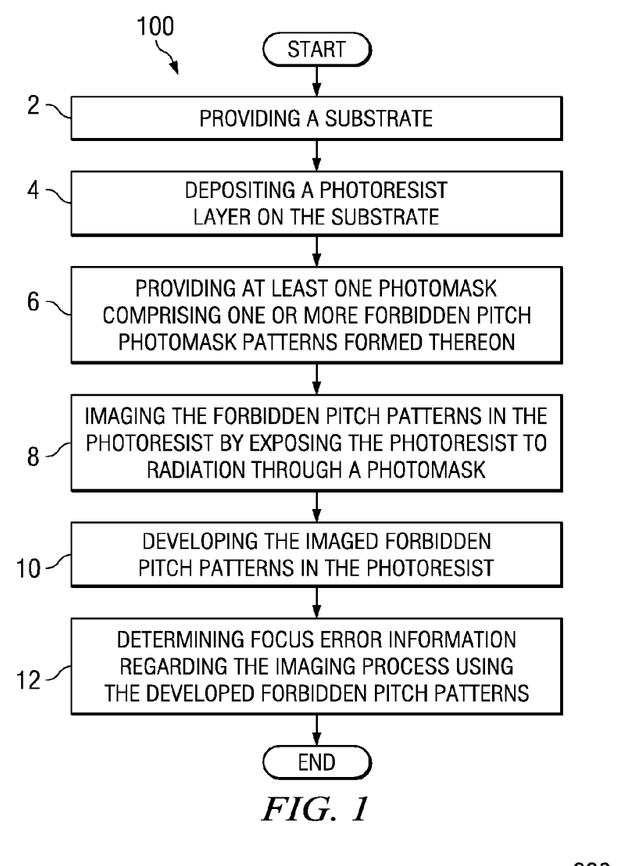
FIG. 1 illustrates a flowchart showing a process for monitoring photolithography focus errors during the production of a device, according to an embodiment of the present disclosure.

FIG. 1 illustrates a method 100 for monitoring photolithography focus errors during the production of a device, according to an embodiment of the present disclosure. The method may be employed for manufacturing any device for which focus sensitive photolithography can be employed in the manufacturing process, such as integrated circuit devices, MEMS devices, flat panel displays and disk heads. In one embodiment, the method is for fabricating an integrated circuit device.

As shown at 2 of FIG. 1, the process can begin by providing a substrate. The substrate can be any suitable substrate, including substrates known for use in the manufacture of any of the above described devices. In one embodiment, the substrate may include one or more partially completed integrated circuit devices. The substrate may include any materials suitable for forming the device being manufactured. Examples of suitable materials include semiconductors, such as single crystal silicon, polysilicon, germanium and gallium arsenide; insulators, such as silicon dioxide, silicon nitride and polyimide; and metals, such as aluminum, copper, titanium, and tungsten. In one embodiment, the substrate includes one or more layers for forming a gate stack, including, for example, a layer of polysilicon.

As shown at 4 of method 100, after the substrate is provided, a photoresist layer is deposited on the substrate. Any type of photoresist layer can be employed, including positive or negative photoresists. Further, any suitable process for forming the photoresist layer can be employed. Suitable processes for forming photoresist layers are well known in the art.

Figure 2A:
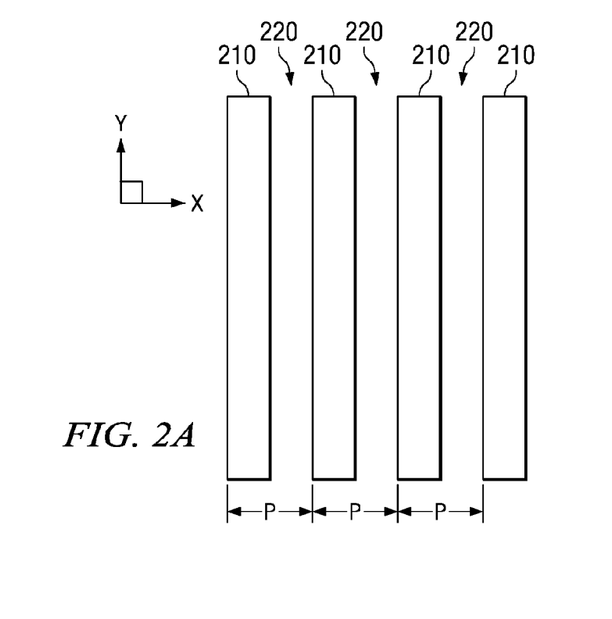
FIGS. 2A and 2B illustrate forbidden pitch monitoring features, according to embodiments of the present disclosure.

As shown at 6 of method 100, at least one photomask is provided including one or more forbidden pitch photomask patterns formed thereon. Any photomask pattern having a forbidden pitch that is suitable for focus monitoring purposes can be employed. One example of such a pattern is illustrated at FIG. 2A, which illustrates monitoring feature lines 210 running parallel with each other and separated by spaces 220. In one embodiment, lines 210 are spaced at regular intervals so as to have a pitch, P, which for purposes of this disclosure is chosen to be a desired length falling within a range of forbidden pitches. In other embodiments, the spacing between lines 210 can be irregular, so long as it results in at least a portion of the pattern having a forbidden pitch.

Figure 3:
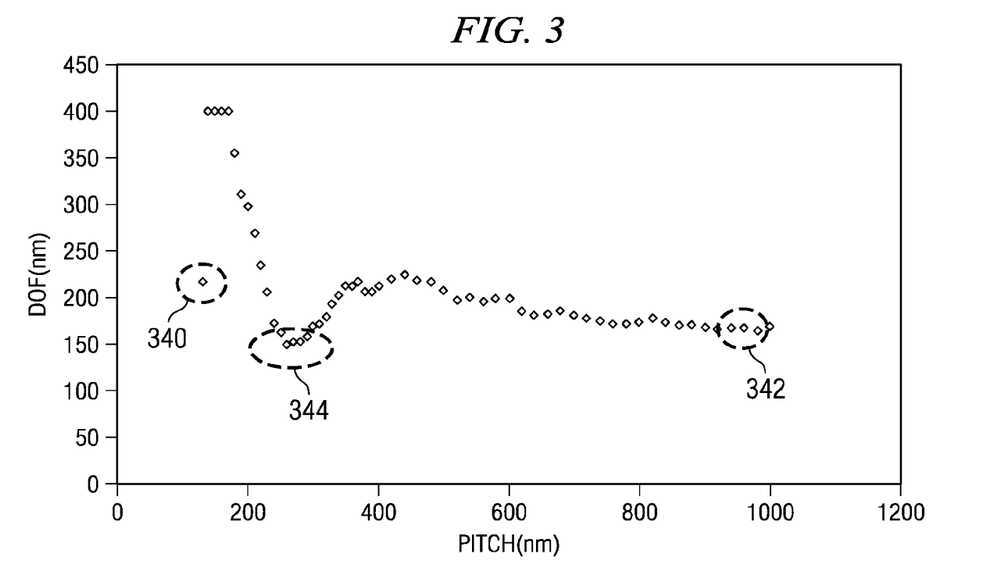
FIG. 3 illustrates a graph plotting DOF as a function of pitch for an exemplary lithography system.

As is well known in the art, depth of focus ("DOF") can vary with the pitch of a pattern. FIG. 3 illustrates a graph showing DOF in nanometers along the vertical axis and pitch in nanometers along the horizontal axis for a 193 nm wavelength, dry argon fluoride laser lithography system having a 0.93 numerical aperture. The illumination conditions for the FIG. 3 data include a C-QUAD illumination source having an outer sigma of 0.78, and an inner sigma of 0.63. As readily seen from FIG. 3, DOF can vary dramatically depending on the pitch of a pattern. For example, the dense feature pitch 340, which is less than 200 nm in the graph, has a DOF of approximately 220 nm in the FIG. 3 example. The isolate pattern pitch 342, which may range from about 900 nm to about 1000 nm in this example, has a DOF of approximately 170 nm.

While the precise range of values for forbidden pitch can vary depending on the lithography system, the forbidden pitch generally lies somewhere between the dense and isolated pitches. Further, forbidden pitch has a DOF that is less than the DOF of either the dense or isolated pitches. The particular range of pitches that are considered forbidden will vary depending on, for example, the illumination conditions, the wavelength of light used, and the numerical aperture of the lithography system employed.

For purposes of the present disclosure, "forbidden pitch" is defined to be the range of pitches for which depth of focus is within about 10% of the minimum depth of focus along a curve plotting DOF versus pitch, for a given lithographic system having a given set of illumination conditions, wavelength of light, and numerical aperture. Given this definition, one of ordinary skill in the art could readily determine a range of forbidden pitches fog a given lithography system. For instance, in the example of FIG. 3, the forbidden pitch 344 may range from about 225 nm to about 250 nm. The DOF for the forbidden pitch is approximately 150 nm to approximately 165 nm, where 150 nm is the minimum DOF for the lithographic system at the chosen illumination conditions, wavelength and numerical aperture.

In embodiments of the present disclosure, the forbidden pitch can be chosen to be within a range of pitches for which depth of focus is within about 5% of the minimum depth of focus for the photolithography system. In yet another embodiment, the forbidden pitch can be the pitch for which depth of focus is the minimum depth of focus for the photolithography system.

Because the forbidden pitch has such a limited depth of focus, patterns having the forbidden pitch can fall out of specification due to lack of focus before either the dense or isolate patterns on a substrate. For this reason, patterns having the forbidden pitch are generally either not included in the active device of the substrate area, or are modified by, for example, increasing the CD of the pattern having the forbidden pitch to improve the process window and allow the forbidden pitch pattern to form.

In the present disclosure, patterns having the forbidden pitch are employed to provide detection of potential focus issues earlier than can be achieved with either dense patterns or isolated patterns using the same monitoring, system with otherwise identical process parameters. Thus, in embodiments of the present disclosure, photomask patterns having a forbidden pitch, such as illustrated in FIG. 2A, can be formed on a photomask. The photomask can be either a test photomask or a production photomask. The patterns can be positioned on the photomask in any location suitable for monitoring purposes, such as in regions of the photomask corresponding to scribe line areas, field regions, or active regions, as is well known in the art. In some embodiments, the forbidden pitch photomask patterns can be employed along with other patterns that are used for monitoring purposes. Examples of such other monitoring patterns are described in U.S. Pat. No. 6,083,531, issued to Singh et al. on May 16, 2000, the disclosure relating to these patterns being hereby incorporated by reference in its entirety. In some embodiments, the forbidden pitch photomask patterns can be positioned proximate to dense pitch and/or isolate pitch monitoring patterns.

The forbidden pitch monitoring pattern of FIG. 2A can be oriented so that lines 210 run in any desired direction on the photomask. For example, lines 210 can run along an x-axis or a y-axis, where the x and y axes are defined to be perpendicular to each other in a plane of the photomask surface. In another embodiment, two forbidden pitch monitoring patterns, one positioned in the x-axis direction and one positioned in the y-axis direction, can be placed proximate to each other on the photomask.

Figure 2B:
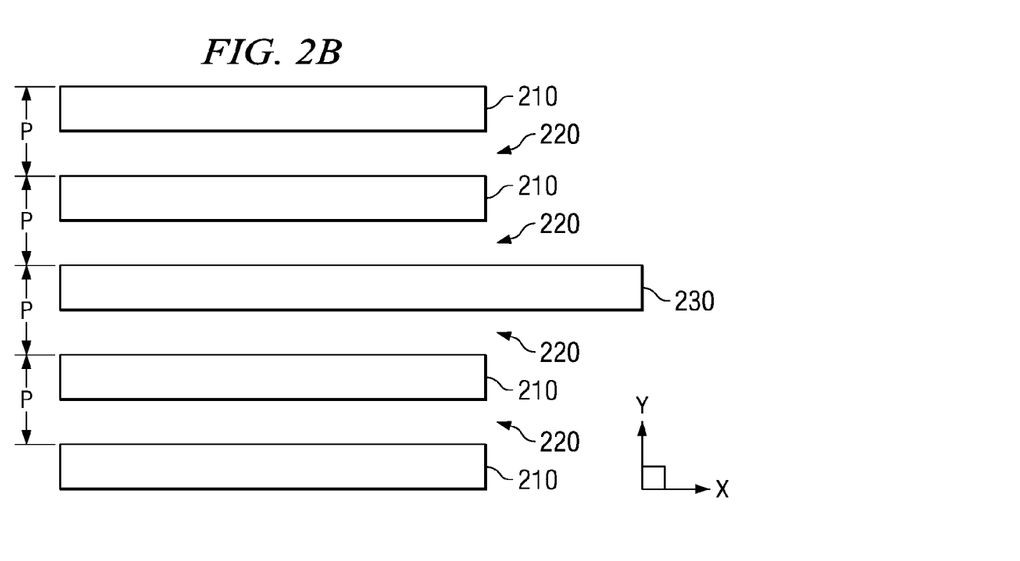

The particular configuration of the monitoring pattern employed is not limited to the pattern shown in FIG. 2A, but can be any suitable pattern capable of incorporating the forbidden pitch. For example, FIG. 2B illustrates another pattern that can be formed having a forbidden pitch, P. The pattern is somewhat similar to the pattern of FIG. 2A, except that the pattern includes a line feature 230 that is longer than line features 210. Line feature 230 can be used to monitor isolated pitch focus, if desired.

In addition, the shape of the monitoring patterns can be modified in the photomask making process to take into account, for example, optical proximity effects and etch effects. Additional features can be added to the photomask patterns, such as sub-resolution assist features, to aid in the formation of the desired pattern shapes in the photoresist during the subsequent imaging process. Such modifications can be performed, for example, in an optical proximity correction process, as is well known in the art.

The photomask pattern can also include other patterns in addition to monitoring patterns. For example, a production photomask can include various device patterns for forming integrated circuit device features, MEMS device features, flat panel display features or any other desired features. In one embodiment, the photomask is for fabricating an integrated circuit, and the patterns can include, but are not limited to, active region patterns, gate patterns, contact patterns and interconnect patterns.

The photomask employed can be any suitable type of photomask. Examples of suitable well known photomasks include attenuated phase shift masks and binary masks. Techniques for fabricating such photomasks are well known in the art.

The photomask can be used in conjunction with any suitable exposure system, including steppers, scanners, or step-and-scan systems, in order to image the forbidden pitch patterns in the photoresist, as illustrated at 8 of FIG. 1. In general, such lithographic systems expose the photoresist to radiation through the photomask. The radiation may be in the form of an e-beam, radiation from a mercury arc lamp, laser or any other suitable illumination means.

Multiple exposures using multiple photomasks can be used to image a single photoresist layer, such as in AltPSM processes, where both phase shift and trim masks are employed. In such processes, one or all of the photomasks can employ forbidden pitch monitoring features.

Figure 5:
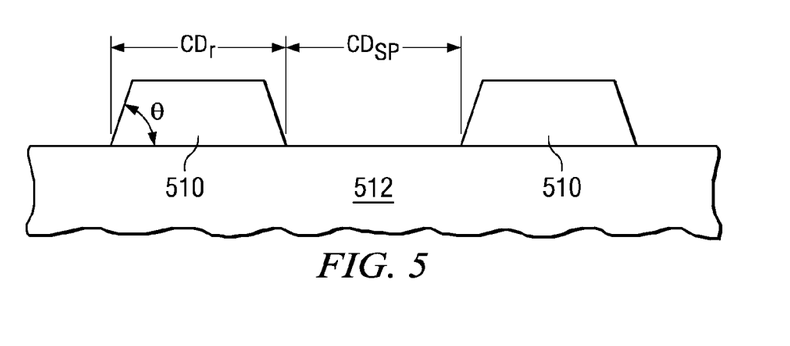
FIG. 5 shows a cross sectional view of a photoresist line pattern formed on a substrate, according to an embodiment of the present disclosure.

The quality of the image pattern formed in the photoresist is a function of exposure and focus. Exposure determines the average energy of the image per unit area and is set by the illumination time and intensity. One effect of changing the value of the exposure is changing the critical dimension (CD) of the lithographically produced lines. For purposes of the present disclosure, critical dimension is defined as the smallest resolvable dimension of a line or space. Examples of critical dimensions are illustrated in FIG. 5, which will be discussed in greater detail below.

Focus determines the decrease in modulation of the imaged pattern relative to the in-focus image. Focus is set by the position of the surface of the resist layer relative to the focal plane of the imaging system. As is well known in the art, the amount of defocus can be measured as the distance the resist layer is positioned away from the fecal plane. Thus, an image that is focused can be referred to as having a focus of F0 microns, indicating that the resist is substantially 0 microns from the focal plane. An image having a focus of F0.05 microns or F−0.05 microns would indicate that the resist is substantially 0.05 microns from the focal plane along a z-axis (the axis that is normal to the plane of the substrate surface on which the resist is formed).

The imaging process will have a potential for some degree of focus error, meaning that the image may be out of focus by some degree. The focus error can be due to, for example, variations in resist layer thickness, substrate topography, and stepper focus drift.

After the imaging process is complete, the photoresist can be developed to form the forbidden pitch patterns in the photoresist, as indicated at 10 of FIG. 1. Any suitable process can be used to develop the imaged photoresist. Processes for developing photoresist are well known in the art.

Figure 4A:
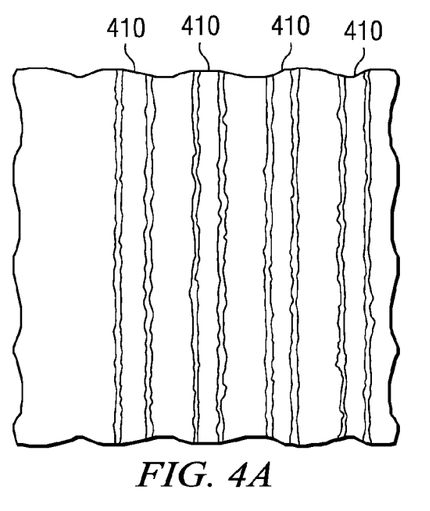
FIGS. 4A and 4B show drawings of SEM images of exemplary photoresist patterns formed using a forbidden pitch.
Figure 4B:
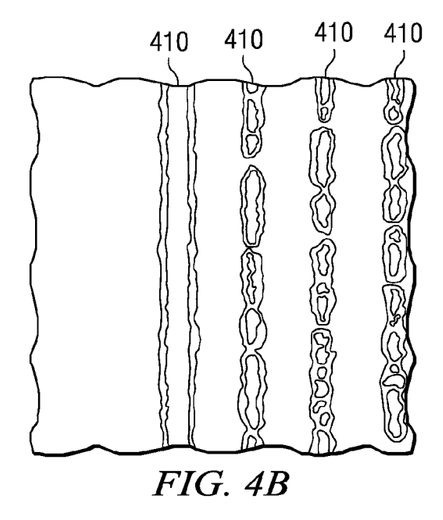

The forbidden pitch patterns formed in the photoresist may vary from those formed on the photomask. For example, as discussed in the background section above, there is often a reduction in the size of the patterns formed on the substrate relative to the photomask patterns. Further, imperfections in the imaging and developing processes will also result in pattern differences, as is well known in the art. For example, where the pattern is substantially out of focus, the monitoring patterns may be poorly formed in the photoresist, and portions of the pattern may not be formed at all. FIG. 4A shows a drawing of an SEM image of an example of photoresist line patterns 410 formed using a forbidden pitch that is in focus. FIG. 4B shows a drawing of an SEM image of an example of photoresist line patterns 410 formed using a forbidden pitch that has substantial focus error.

After the photoresist pattern is developed, focus error information can be determined regarding the imaging process using the forbidden pitch photoresist patterns using any suitable method. In an embodiment, this can involve measuring a dimension of the forbidden pitch photoresist patterns, such as CD or slope. Examples of such dimensions are illustrated in FIG. 5, which shows a cross-sectional view of photoresist line patterns 510 formed on a substrate 512. As shown, a critical dimension of the space between the lines ("$CD_{sp}$") can be measured, as can a critical dimension of the photoresist lines 510 ("$CD_r$"). In addition, the sidewalls of photoresist lines 510 have a slope, θ, that can be measured. These dimensions can be measured using any suitable technique. Exemplary techniques known in the art include taking measurements using CDSEM or Scatterometry.

Figure 8:
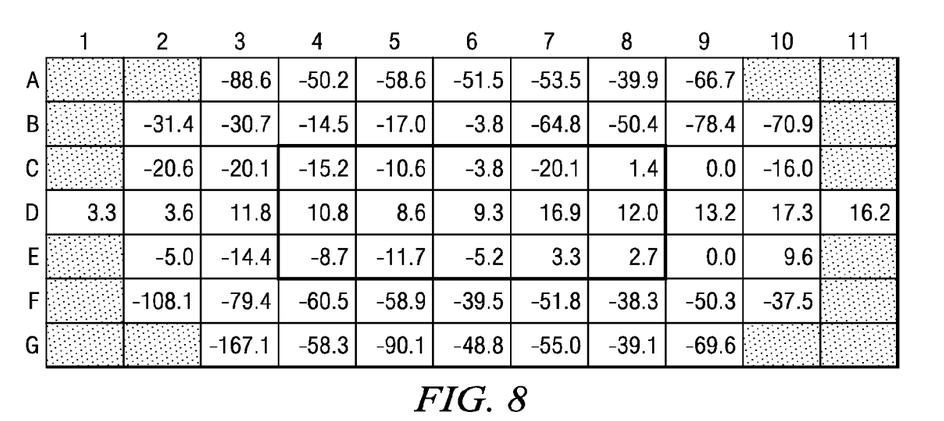

The CD measurements and/or slope values can be used either separately or in mathematical relationships with other parameters to determine the desired information regarding defocus. In an embodiment of the present disclosure, manual or automatic methods for determining and controlling defocus can be set up using statistical process control charts that employ CD and/or resist slope values from the forbidden pitch features, as well as measurements from dense and/or isolate features. Examples of such charts are illustrated in FIGS. 6 and 8. Examples of methods for calculating focus error information employing these charts will now be described.

Figure 6A:
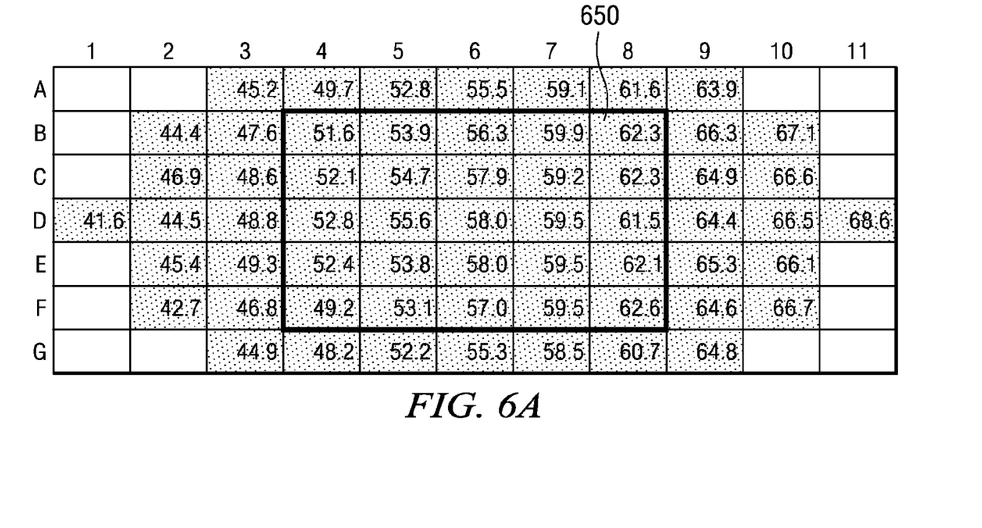
FIG. 6A shows a chart of $CD_{sp}$ values measured using CDSEM for a photoresist pattern of dense features on a wafer, according to an embodiment of the present disclosure.

The numbers in the chart of FIG. 6A are $CD_{sp}$ values measured using CDSEM for dense features on a wafer, where each value is for a different shot of the substrate. For all of FIGS. 6A to 6D, 7A to 7B and 8, each value corresponds to a different combination of exposure energy and focus offset. Exposure energy is 38 mj/cm² for column 1 and increases by 1 mj/cm² increments with each column of the charts going from left to right (e.g., column 2 is 39 mj/cm², column 3 is 40 mj/cm² and so on). Focus offsets A to G are stepped in 50 nm increments with each row of the chart, beginning at a focus of set of F−0.15 microns for row A and ending at F+0.15 microns for row G, where row D is F0.

The numbers in block 650 of FIG. 6A represent the $CD_{sp}$ values for dense features that are also within an acceptable process window of focus and exposure energy for isolated monitoring patterns monitored in the same shots. Actual $CD_{sp}$ values for the isolated monitoring patterns are not shown. The isolated features used for determining the data in FIG. 6A had a pitch of about 1 micron. Because isolated monitoring patterns generally have a decreased depth of focus compared to dense features, block 650 of FIG. 6A narrows the acceptable range of focus offset and exposure energy combinations relative to the dense feature values. Thus, the acceptable DOF is about 200 nm for the isolated features, and this depth of focus will limit the acceptable DOF for the overall process. However, within this narrower process window of block 650 it is difficult to discern defocus using data from the dense and isolate monitoring patterns so as to provide additional focus adjustment process control.

Figure 6B:
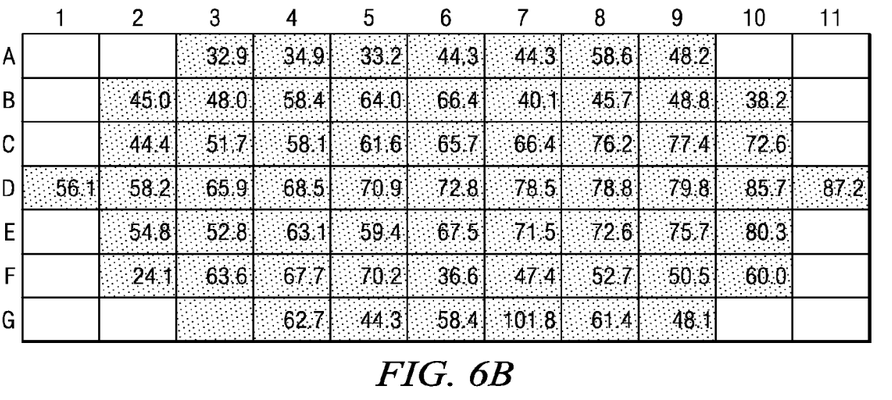
FIGS. 6B and 6C show a chart of $CD_{sp}$ values measured using CDSEM for a photoresist pattern formed using a forbidden pitch, according to an embodiment of the present disclosure.
Figure 6C:
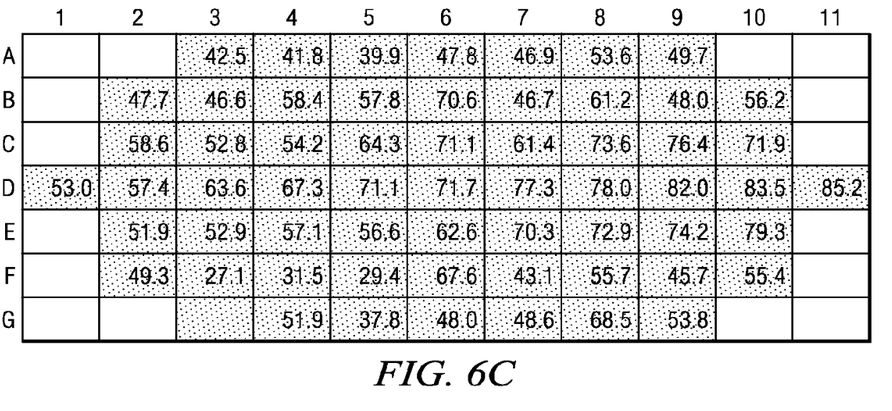

The values in the individual blocks of the charts of FIGS. 6B and 6C correspond to the same shots of the wafer as the similarly positioned values in the blocks of FIG. 6A, employing the same exposure energy and focus setting. Thus, for example, row D, column 1 of FIGS. 6A, 6B and 6C all show values from the same shot using the same combination of exposure energy and focus settings. However, FIGS. 6B and 6C show values measured using CDSEM for two independently measured forbidden pitch $CD_{sp}$ within the shots. For purposes of this example, the values in FIG. 6B will be referred to as Forbidden CD1 and the values of FIG. 6C will be referred to as forbidden CD2. The forbidden pitch in this example is about 260 nm.

Figure 6D:
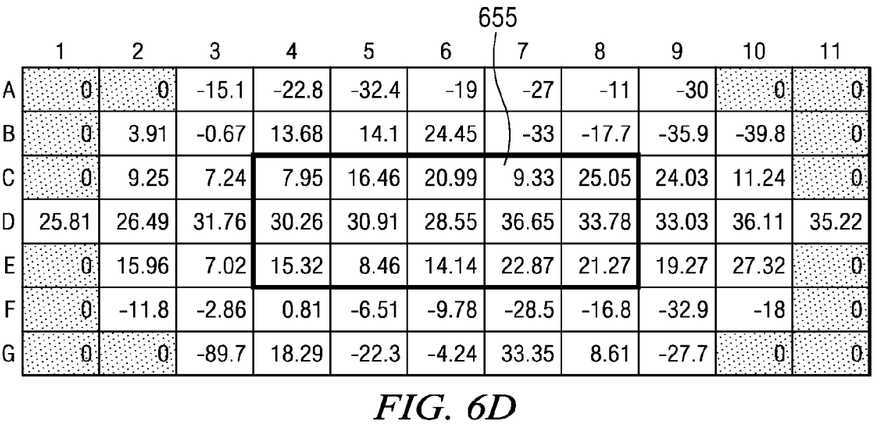
FIG. 6D shows focus information values calculated using the data of FIGS. 6A to 6C, according to an embodiment of the present disclosure.

The numbers in the charts can be employed in the following formula:

Focus Information Value=Forbidden $CD1$+Forbidden $CD2$−2(Dense $CD$)   (I)

where Dense CD, Forbidden CD1, and Forbidden CD2 values are taken from corresponding shot blocks of the charts of FIGS. 6A, 6B and 6C, respectively. Using two forbidden CD measurements (forbidden CD1 and CD2) in Formula (I) is thought to help reduce noise inherent in the CDSEM measurements. Substracting the Dense CD values reduces the effect of exposure energy in the focus information values, so that the values more readily indicate the effect of focus. The resulting focus information values are shown in FIG. 6D. These focus information values can be compared to an arbitrarily chosen focus judgment specification value to determine focus settings for achieving a desired focus. p The focus judgment specification value can be any desired value that is determined to be suitable based on the focus information values calculated and the desired degree of focus. For example, in the example of FIG. 6D a focus judgment specification of 27 or greater was chosen because the F0 shots of row D within box 655 have values ranging from about 28 to about 33, while the F−0.05 and F+0.05 shots of rows C and E have values ranging from about 7 to about 25. Thus, based on the experimentally obtained values of FIG. 6D, 27 or greater was judged to be an appropriate value indicating good focus. However, in this example, lower or higher values could have been chosen, such as, for example,. any value ranging from about 24 to 29.

The focus information values of FIG. 6D would indicate that focus settings C, D, and E within block 655 will provide improved focus settings compared with the other focus settings shown, and more specifically that focus setting D may provide the best focus setting. Using these focus information values, defocus variations can be more easily seen than when dense and isolated CD values alone were used, as in FIG. 6A. Because the defocus variations are more easily seen, focus can be controlled within, for example, ±50 nm when the dense CDs and forbidden pitch CDs are used together.

Many other suitable formulae can be employed instead of Formula (I) above. For example, more than two independently measured forbidden CD values could be used, in which case the same number of dense CD values would be substracted (e.g., if three forbidden pitch CDs are used, the dense CD value would be multiplied by 3 instead of 2). Further, averaging focus information values over multiple wafers may further filter out any noise in the data.

Figure 7A:
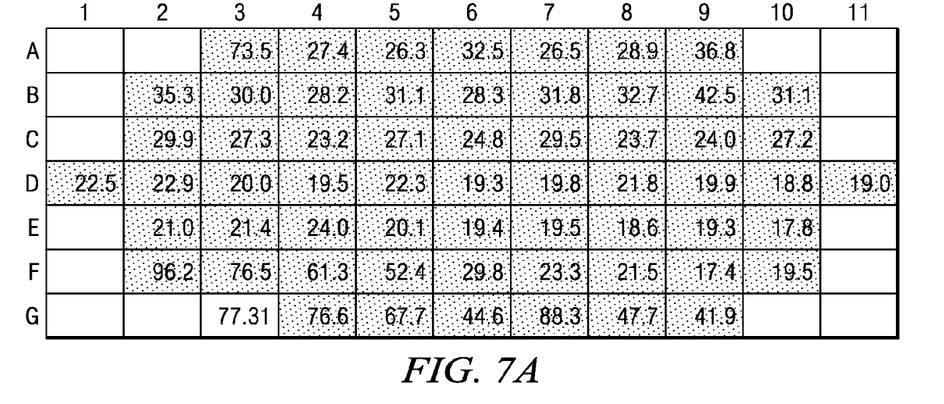
FIG. 7A shows a chart of slope values of a photoresist pattern formed using a forbidden pitch that were measured using CDSEM according to an embodiment of the present disclosure.
Figure 7B:
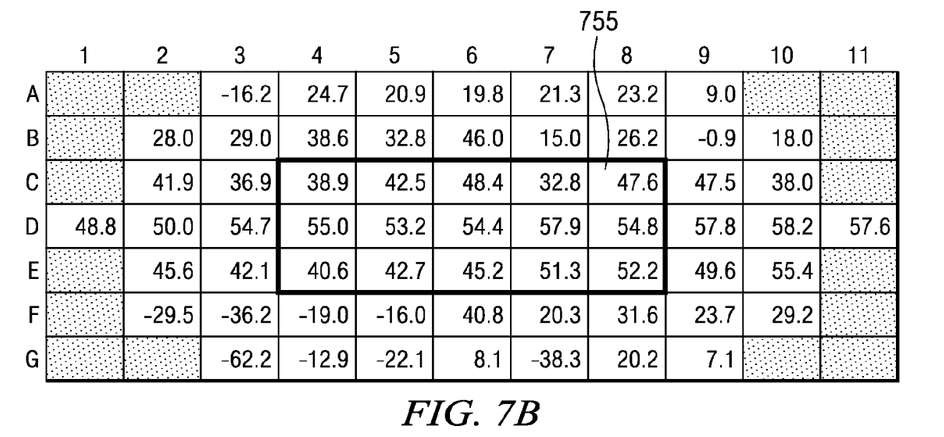
FIGS. 7B and 8 show focus information values calculated according to embodiments of the present disclosure.

A similar calculation can be performed using a combination of CD values and slope. For example, the numbers in the charts can be employed in the following formula:

Focus information value=Forbidden $CD2$−Forbidden Slope+60−Dense $CD$   (II)

where Dense CD, Forbidden CD2, and Forbidden Slope values are taken from corresponding shot blocks of the charts of FIGS. 6A, 6C, and 7A, respectively. The number 60 used in the formula is an arbitrary value chosen to make the focus information values generally come out positive, but could be any desired value, and need not necessarily be included in the formula. The resulting focus information values are shown in FIG. 7B.

These focus information values can be compared to a chosen focus judgment specification value to determine exposure energy and focus settings for achieving a desired focus, similarly as described above for the data of FIG. 6D. For example, in the case of the values shown in FIG. 7B, a focus judgment specification of 50 or greater can be chosen. Thus, values of 50 or over in this example would indicate good focus. This would in turn indicate that focus settings C, D, and E within block 755 of FIG. 7B will provide improved focus settings compared with the other focus settings shown, and more specifically that focus setting D may provide the best focus setting. In this manner, focus can be controlled within ±50 nm using dense CDs, slope and forbidden pitch CDs. Many other suitable formulae can be employed instead of Formula (II) above to determine focus information using slope and forbidden pitch CD. In addition, as with Formula (I), averaging focus information values over multiple wafers can further filter out any noise in the data.

Similarly as with Formulae I and II above, the focus information values of Formula III can be compared to a chosen focus judgment specification value to determine exposure energy and focus settings for achieving a desired focus. For example, in the case of the values shown in FIG. 6, a focus lodgment specification of about 3 or greater can be chosen. Thus, values of 3 or greater in this example would indicate good focus.

By employing the methods of the present disclosure, defocus can be detected and corrected. Correcting the defocus can be accomplished by adjusting a focus setting of the lithography system based on the focus error information. Thus, for example, the focus settings following the exposure of a first substrate can be accosted based on the focus information values obtained from the first substrate using techniques discussed above. A second substrate can then be processed in the lithography system using the adjusted focus settings. In this manner, improved focus can be maintained during substrate processing. Focus control using the forbidden pitch methods disclosed herein can be performed manually or automatically using any acceptable process control techniques.

Employing the forbidden pitch in monitoring patterns as described herein can potentially save process time and costs and result in improved focus control. Often corrections to focus can be made before the important features of the device patterns are affected to a degree that would require removal of the photoresist pattern and the application and patterning of a new photoresist layer. However, in cases where defocus is not caught before the device feature patterns are out of specification, removal of the first photoresist pattern and patterning of another photoresist layer may be performed.

Once it is determined that the photoresist pattern is within desired specifications, the substrate can be etched using the photoresist pattern as a mask. This can be accomplished by any suitable etching techniques, which may include, for example, both wet or dry etch processes. The photoresist pattern can then be removed and any additional processing desired to complete the device can then be carried out.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that can vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the," include plural referents unless expressly and unequivocally limited to one referent. Thus, for example, reference to "an acid" includes two or more different acids. As used herein, the term "include" and its grammatical variants are intended to be non-limiting, such that recitation of items in a list is not to the exclusion of other like items that can be substituted or added to the listed items.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

What is claimed is:

1. A method for monitoring focus of a photolithography system, the method comprising:
    providing a substrate;
    depositing a photoresist layer on the substrate;
    providing at least one photomask comprising one or more forbidden pitch photomask patterns formed thereon;
    imaging the forbidden pitch patterns in the photoresist layer by exposing the photoresist layer to radiation through the at least one photomask;
    developing the imaged forbidden pitch patterns in the photoresist; and
    determining focus error information regarding the imaging process using the developed forbidden pitch patterns.

2. The method of claim 1, wherein the forbidden pitch has a depth of focus that is within about 5% of the minimum depth of focus for the photolithography system.

3. The method of claim 1, wherein the forbidden pitch has substantially the minimum depth of focus for the photolithography system.

4. The method of claim 1, wherein determining the focus error information comprises measuring a critical dimension of the developed forbidden pitch patterns.

5. The method of claim 4, wherein CDSEM is used to measure the critical dimension.

6. The method of claim 1, wherein determining the focus error comprises measuring a slope of a sidewall of the forbidden pitch patterns.

7. The method of claim 1, further comprising adjusting a focus setting of the lithography system based on the focus error information.

8. A device manufacturing method, comprising:
    providing a substrate;
    depositing a photoresist layer on the substrate;
    providing at least one photomask comprising one or more forbidden pitch photomask patterns formed thereon;
    imaging the forbidden pitch patterns in the photoresist by exposing the photoresist to radiation through the at least one photomask;
    developing the imaged forbidden pitch patterns in the photoresist;
    determining focus error information regarding the imaging process using the developed forbidden pitch patterns;
    etching the substrate using the photoresist pattern as a mask; and
    removing the photoresist pattern.

9. The method of claim 8, wherein the device is an integrated circuit device, the substrate comprises a polysilicon layer, and the at least one photomask further comprises at least one gate pattern.

10. The method of claim 8, wherein the forbidden pitch has a depth of focus that is within about 5% of the minimum depth of focus for the photolithography system.

11. The method of claim 8, wherein the forbidden pitch has substantially the minimum depth of focus for the photolithography system.

12. The method of claim 8, wherein determining the focus error information comprises measuring a critical dimension of the one or more developed forbidden pitch patterns.

13. The method of claim 12, wherein CDSEM is used to measure the critical dimension.

14. The method of claim 8, wherein determining the focus error comprises measuring a slope of a sidewall of the forbidden pitch patterns.

15. The method of claim 8, further comprising adjusting a focus setting of the lithography system based on the focus error information.

16. The method of claim 8, wherein the substrate comprises one or more scribe line areas, and further wherein at least some of the forbidden pitch patterns are developed in the photoresist over the scribe line areas.

* * * * *